(12) United States Patent
Hu et al.

(10) Patent No.: US 6,242,355 B1
(45) Date of Patent: Jun. 5, 2001

(54) METHOD FOR INSULATING METAL CONDUCTORS BY SPIN-ON-GLASS AND DEVICES MADE

(75) Inventors: Ding Dar Hu, Taichung; Mei Yen Li, Hsin-Chu; Li Dum Chen, Hsin-Chu; Jing Kuan Lin, Hsin-Chu, all of (TW)

(73) Assignee: Taiwan Semiconductor Manufacturing Company, Ltd, Hsin Chu (TW)

( * ) Notice: Subject to any disclaimer, the term of this patent is extended or adjusted under 35 U.S.C. 154(b) by 0 days.

(21) Appl. No.: 09/141,278

(22) Filed: Aug. 27, 1998

(51) Int. Cl.[7] .................. H01L 21/311; H01L 21/302; H01L 21/31; H01L 21/4763; H01L 23/58
(52) U.S. Cl. .................. 438/699; 438/697; 438/743; 438/783; 438/787; 438/790; 438/634; 257/637; 257/644
(58) Field of Search ..................... 438/759, 782, 438/783, 780, 787, 790, 623, 624, 631, 633, 634, 697, 699, 743; 257/632, 635, 637, 644

(56) References Cited

U.S. PATENT DOCUMENTS

| 5,636,401 | * | 6/1997 | Yonemizu et al. | 15/77 |
| 5,855,811 | * | 1/1999 | Grieger et al. | 252/79.3 |
| 5,960,317 | * | 9/1999 | Jeong | 438/633 |

* cited by examiner

Primary Examiner—Long Pham
Assistant Examiner—Neal Berezny
(74) Attorney, Agent, or Firm—Tung & Associates

(57) ABSTRACT

A method for insulating metal conductors by spin-on-glass in inter-metal dielectric layers and devices formed by such method are disclosed. In the method, an additional step of scrubber clean is incorporated after an etch-back process on the spin-on-glass layer is conducted. Contaminating metal ions such as those of calcium is thus removed to eliminate formation of voids by such particles. The method can be easily implemented by including the additional scrubber clean step into a total wafer fabrication recipe.

16 Claims, 3 Drawing Sheets

2000 Å

2500 Å

3000 Å

3500 Å

4000 Å

4500 Å

METHOD FOR INSULATING METAL CONDUCTORS BY SPIN-ON-GLASS AND DEVICES MADE

FIELD OF THE INVENTION

The present invention generally relates to a method for insulating metal conductors in a semiconductor device by a dielectric material and more particularly, relates to a method for forming inter-metal dielectric layers in a semiconductor structure of a spin-on-glass material wherein a scrubber clean step after a spin-on-glass etch-back process is incorporated to remove the residue of a surfactant to prevent void formation and semiconductor structures made by such method.

BACKGROUND OF THE INVENTION

Spin-on-glass (SOG) is frequently used for gap fill and planarization of inter-level dielectrics (ILD) in multi-level metalization structures. It is a desirable material for use in low-cost fabrication of IC circuits. Most commonly used SOG materials are of two basic types; an inorganic type of silicate based SOG and an organic type of siloxane based SOG. One of the commonly used organic type SOG materials is a silicon oxide based polysiloxane which is featured with radical groups replacing or attaching to oxygen atoms. Based on these two basic structures, the molecular weight, the viscosity and the desirable film properties of SOG can be modified and adjusted to suit the requirement of specific IC fabrication process.

SOG film is typically applied to a pre-deposited oxide surface as a liquid to fill gaps and steps on the substrate. Similar to the application method for photoresist films, a SOG material can be dispensed onto a wafer and spun with a rotational speed which determines the thickness of the SOG layer desired. After the film is evenly applied to the surface of the substrate, it is cured at a temperature of approximately 400° C. and then etched back to obtain a smooth surface in preparation for a capping oxide layer on which a second interlevel metal may be patterned. The purpose of the etch-back step is to leave SOG between metal lines but not on top of the metal, while the capping oxide layer is used to seal and protect SOG during further fabrication processes. The siloxane based SOG material is capable of filling 0.15 micron gaps and therefore it can be suitably used in 0.25 micron technology.

When fully cured, silicate SOG has similar properties like those of silicon dioxide. Silicate SOG does not absorb water in significant quantity and is thermally stable. However, one disadvantage of silicate SOG is the large volume shrinkage during curing. As a result, the silicate SOG retains high stress and cracks easily during curing and further handling. The cracking of the SOG layer can cause a serious contamination problem for the fabrication process. The problem can sometimes be avoided by the application of only a thin layer, i.e., 1000~2000 Å of the silicate SOG material.

A typical process utilizing SOG material as an inter-metal dielectric (IMD) insulation is shown in FIGS. 1A~1E. As shown in FIG. 1A, a semiconductor structure 10 which has metal conductors 12, 14 built on a pre-processed semi-conducting substrate with an oxide layer 16 on top. The oxide layer may be suitably deposited of a boro-phospho-tetraethoxy-silicate (BPTEOS) material that is used to insulate previously deposited metal layers. The metal conductors 12, 14 are formed by first depositing a metal layer on a diffusion barrier layer (not shown) such as TiN before the deposition of an AlCu material. On top of the metal conductor material, an adhesion promoter layer such as Ti or TiN may also be deposited before an oxide cap layer 20 is used to insulate the metal conductors 12, 14. The oxide cap layer 20 may be deposited of a plasma enhanced oxide (PEOX) material. On top of the semiconductor structure 10, a first SOG layer 22 is then deposited to seal the metal conductors 12, 14 therein. Since SOG material has a large volume shrinkage ratio when it is deposited in a liquid form, the deposition step for SOG is preferably conducted in two separate stages for achieving a desirable thickness of SOG. The first SOG layer 22 is deposited and allowed to cure forming a dip 24 in its top surface 26. Prior to the second deposition step for SOG, an adhesion promoter layer (or a surfactant) is normally necessary to improve the adhesion of a liquid SOG to a cured SOG layer.

Since surfactant materials normally contain metal ions, especially calcium ions, calcium ions 30 are frequently left on the top surface 26 of the first SOG layer 22. This is shown in FIG. 2B. When a second SOG layer 32 is later deposited on top of the first SOG layer 22, the metal ions 30 are trapped at the interface 36 between the two SOG layers 22 and 32. Each of the SOG layers is deposited to a thickness of between about 2000 Å and about 4000 Å, and preferably to 3000 Å for achieving a total thickness of about 6000 Å. This is shown in FIG. 1C.

In the next step of the process, the SOG layer 32 is etched back to approximately the interface 36 for achieving a planarized surface 38 such that the next insulating layer of PEOX 40, as shown in FIG. 1E, may be deposited. The undesirable metal ions 30 are thus trapped between the newly deposited PE oxide layer 40 and the first SOG layer 22. Protruded areas 42 in a top surface 44 of the PE oxide layer 40 are also formed due to the presence of the metal ions 30.

In a subsequent process wherein a via contact 50 is formed, a wet etch process is used to etch away the PE oxide layer 40 and the first SOG layer 22 after a via opening is first defined by a photolithographic process. During the wet etch process, the metal ions 30, i.e., calcium ions, can be easily etched away by the wet etchant and thus creating a void in the insulating layer. As a result, a large volume 48 of the first SOG layer 22 is etched away forming a large void. This type of void formation causes severe quality and reliability problems in the semiconductor devices built. A poor wafer yield is resulted from such defects.

Wafers prepared by the conventional technique shown in FIGS. 1A~1E were tested in a KLA® machine, data and wafer maps obtained are shown in Table 1 and FIGS. 2A~2F, respectively.

TABLE 1

|  | #01 | #02 | #03 | #04 | #05 | #06 | #07 |
| --- | --- | --- | --- | --- | --- | --- | --- |
| SOG Etch Back | 2K | 2.5K | 4K | 3.5K | 4K | 3K | 2K |
| Defect Count | 146 | 1319 | >15000 | >15000 | >15000 | >5000 | 322 |

Wafer samples, after the double SOG deposition, are etched back to different thicknesses of the second SOG layer. For instance, sample 1 was etched back 2000 Å, sample 2 was etched back 2500 Å, sample 3 was etched back 4000 Å, sample 4 was etched back 3500 Å, sample 5 was etched back 4000 Å, sample 6 was etched back 3000 Å and sample 7 was etched back 2000 Å. Table 1 indicates that the defect count performed by the KLA® machine indicates that the maximum defect occurs at approximately the interface between the first SOG layer and the second SOG layer, i.e., at an etch depth of 3500 Å or 4000 Å.

FIGS. 2A~2F show wafer maps obtained from KLA® machine wherein the maps were drawn by placing an ink dot at each defect location. When the SOG layer is etched back 2000 Å, as shown in FIG. 2A, very few defects are shown. When the etch-back increased to 2500 Å, the outside fringe of the wafer is normally etched faster than the center part of the wafer and therefore, the outside fringe has been etched away to almost 3000 Å, i.e., to a depth that is in close proximity to the SOG-1 and the SOG-2 interface. FIG. 2B therefore shows a wafer map wherein more defects are shown in an outer fringe of the wafer than the center part of the wafer. As the etch-back thickness increase to 3000 Å, as shown in FIG. 2C, the number of defects shown by the ink dots have greatly increased and once again, the outer fringe of the wafer showed more defects since the outer fringe was etched to a larger thickness. The most defects are observed in the wafer map obtained at an etch-back thickness of 3500 Å, as shown in FIG. 2D. This indicates that at the 3500 Å etch-back thickness, the interface between the two SOG layers is reached. The defect count is slightly reduced at an etch-back depth of 4000 Å from that observed at 3500 Å. This is shown in FIG. 2E. The defect count greatly reduces when the etch-back thickness is increased to 4500 Å therefore indicating that the etch-back process has progressed into the first SOG layer, and as such, defects caused by the metal ions at the interface no longer show.

It is therefore an object of the present invention to provide a method for insulating metal conductors by spin-on-glass that does not have the drawbacks or shortcomings of the conventional methods.

It is another object of the present invention to provide a method for insulating metal conductors by using spin-on-glass in inter-metal dielectric layers.

It is a further object of the present invention to provide a method for insulating metal conductors by spin-on-glass wherein a surfactant layer is utilized between two spin-on-glass layers by etching-back the second spin-on-glass layer and then scrub cleaning an exposed interface.

It is another further object of the present invention for insulating metal conductors by spin-on-glass wherein metal ion impurities existing at an interface between two spin-on-glass layers is effectively removed to eliminate void formation.

It is still another object of the present invention to provide a method for insulating metal conductors by spin-on-glass by incorporating a scrubber clean step after a spin-on-glass etch-back process for removing metal ion contaminants.

It is yet another object of the present invention to provide a method for forming inter-metal dielectric layers in a semiconductor structure by scrubber cleaning an interface between two spin-on-glass layers with a soft-bristle brush for removing metal ions.

It is still another further object of the present invention to provide a semiconductor structure that includes an inter-metal dielectric layer of spin-on-glass and an oxide insulating layer on top of the inter-metal dielectric layer without void formation thereinbetween.

It is yet another further object of the present invention to provide a method for forming inter-metal dielectric layers in a semiconductor structure by incorporating an additional processing step of scrubber clean an interface between two spin-on-glass layers with a polyvinyl alcohol (PVA) brush and water to substantially remove all residual metal ions at the interface.

SUMMARY OF THE INVENTION

In accordance with the present invention, a method for insulating metal conductors by a spin-on-glass material and devices made by such method are provided.

In a preferred embodiment, a method for insulating metal conductors by spin-on-glass is provided which can be carried out by the operating steps of first providing a pre-processed semiconductor structure that has metal conductors formed on a top surface, depositing a first insulating layer on top of the metal conductors and the top surface of the structure, planarizing the structure with a first spin-on-glass layer, coating the top surface of the first spin-on-glass layer with an adhesion promoter layer, planarizing the structure with a second spin-on-glass layer forming an interface with the first spin-on-glass layer, etching back the second spin-on-glass layer to substantially expose the interface, cleaning the substantially exposed interface in a scrubbing process, and depositing a second insulating layer on top of the interface.

The method may further include the step of forming the metal conductors by a stack of diffusion barrier layer/metal/adhesion layer. The first insulating layer may be deposited of an oxide layer. The first spin-on-glass layer may be deposited to a thickness between about 2000 Å and about 4000 Å and preferably to a thickness of about 3000 Å. The adhesion promoter layer coated contains metal ions which become contaminant to the semiconductor structure. The second spin-on-glass layer can be deposited to a thickness between about 2000 Å and about 4000 Å. The method may further include the step of scrubber clean the substantially exposed interface with a soft-bristle brush and water as a cleaning fluid, or the step of scrubber clean the substantially exposed interface with a polyvinyl alcohol (PVA) brush and water as a cleaning fluid. The second insulating layer deposited may be a plasma enhanced oxide layer. The adhesion promoter layer used between the two spin-on-glass layers contains calcium ions which cause void formation in a subsequent wet etch process for forming a via contact with the metal conductors.

In another preferred embodiment, the present invention method for forming inter-metal dielectric layers in a semiconductor structure can be carried out by the steps of providing a pre-processed semiconductor structure that has at least one layer of metal conductors on top, insulating an uppermost layer of metal conductor with a first plasma enhanced oxide layer, planarizing sequentially the structure with a first spin-on-glass layer and a second spin-on-glass layer with a surfactant coating between the two layers, etching back the second spin-on-glass layer to substantially expose the interface, scrubber clean the interface, and depositing a second plasma enhanced oxide layer on top of the cleaned interface.

The surfactant coated at the interface between the two spin-on-glass layers contains metal ions, including calcium ions. The method may further include the step of scrubber clean the interface with a soft-bristle brush and a cleaning fluid of water, or the step of scrubber clean the interface with a polyvinyl alcohol (PVA) brush and water until substantially all residual metal ions at the interface are removed.

The present invention is further directed to a semiconductor structure that includes at least one metal conductor formed on a semiconducting substrate, an inter-metal dielectric (IMD) layer of spin-on-glass on top of the at least one metal conductor, an oxide insulating layer on top of the IMD layer, and a via contact formed in the oxide insulating layer and the IMD layer in electrical communication with one of the at least one metal conductor and substantially no void formation caused by metal ions at an interface between the IMD layer and the oxide insulating layer.

The IMD layer may further include a first spin-on-glass layer on top of the at least one metal conductor and a residual second spin-on-glass layer overlying the first spin-on-glass layer wherein the second spin-on-glass layer is substantially removed in an etch-back process. The oxide insulating layer may be formed of a plasma enhanced oxide. The semiconductor structure may further include a plasma enhanced oxide layer between the at least one metal conductor and the inter-metal dielectric layer of spin-on-glass.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a method for insulating metal conductors by spin-on-glass in IMD layers by utilizing an additional scrubber clean step after an etch-back process is conducted on a second spin-on-glass layer such that void formation can be eliminated. The present invention is also directed to semiconductor structures fabricated by the present invention novel method. The structure obtained is without void and thus provides greatly improved wafer yield.

It is a unique discovery of the present invention that tiny particles of metal ions in a size between about 0.1 $\mu$m and about 0.2 $\mu$m of certain metal such as calcium can be removed by mechanical brushing in a scrubber clean process with water as a cleaning fluid. The wafer yield after such a scrubber clean process is conducted is greatly improved, so is the reliability of the devices formed. It was discovered that while a surfactant is frequently used to improve the striation between two SOG layers for achieving better adhesion, a high concentration of calcium ions in the surfactant easily condensate in the interface and thus forming tiny particles in an etch-back process. The tiny particles cause SOG void formation and thus yield loss and reliability downgrade. The particle distribution map, as shown in KLA® wafer maps was found to be donut-like with more defects discovered along the periphery of the wafer. Most of the particles are smaller than 1 micron diameter. The tiny particles induce SOG void formation in a subsequent via opening wet etch process.

The present invention novel method can therefore be carried out in a process for insulating metal conductors by spin-on-glass incorporation of an additional scrubber clean step. After an etch-back process is conducted on SOG layers, metal ions such as that of calcium which were impurities in a surfactant coating were discovered. The interface where the surfactant was applied can then be scrubber cleaned by a soft bristle brush, i.e., by a PVA brush (a brush made of polymeric materials such as polyvinyl alcohol).

Figure 1A:
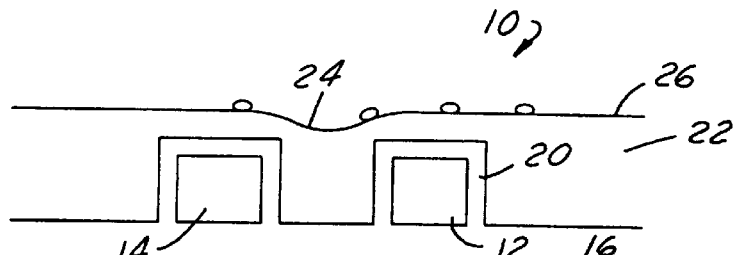
FIG. 1A is an enlarged, cross-sectional view of a conventional semiconductor structure having metal conductors and a SOG layer deposited on top.
Figure 1B:
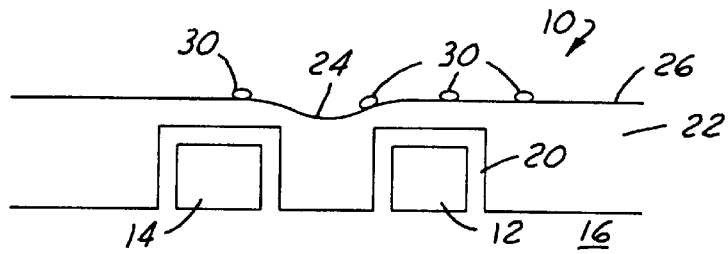
FIG. 1B is an enlarged, cross-sectional view of the conventional semiconductor structure of FIG. 1A having metal ions from a residual surfactant layer coated on top of the first SOG layer.
Figure 1C:
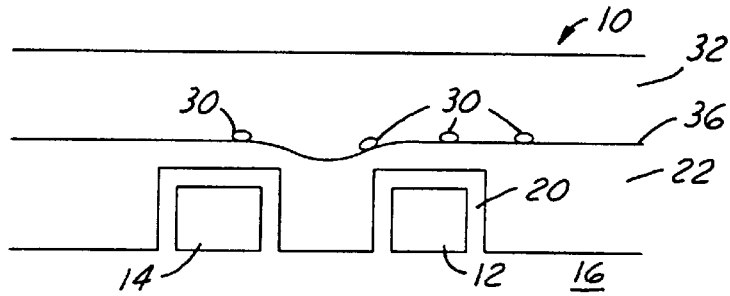
FIG. 1C is an enlarged, cross-sectional view of the conventional semiconductor structure of FIG. 1B having a second spin-on-glass layer deposited on top sandwiching the metal ions.
Figure 1D:
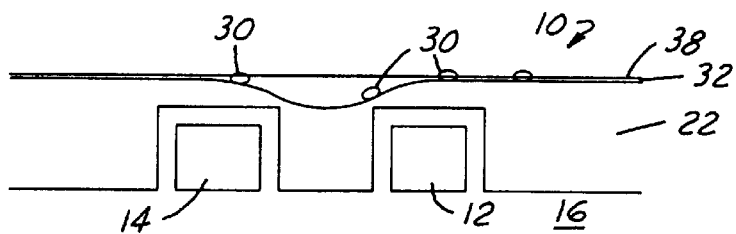
FIG. 1D is an enlarged, cross-sectional view of the conventional semiconductor structure of FIG. 1C having the second spin-ore-glass layer etched back.
Figure 1E:
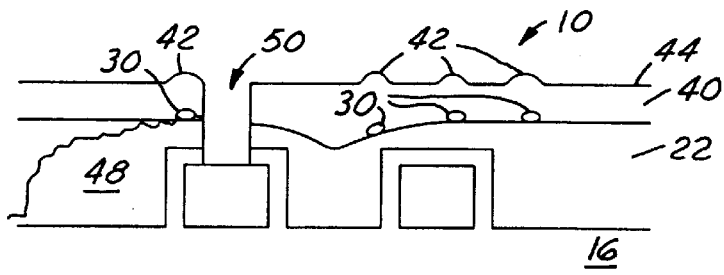
FIG. 1E is an enlarged, cross-sectional view of the conventional semiconductor device of FIG. 1D having an additional oxide insulating layer deposited on top, a via contact formed on a metal conductor, and a large void formation after a wet etch process for forming the via opening caused by a metal ion.
Figure 2A:
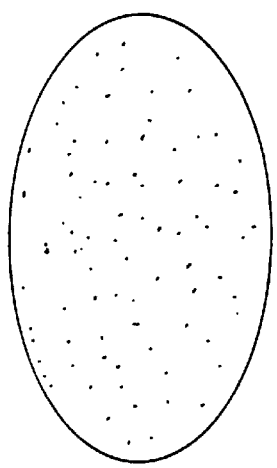
FIG. 2A is a wafer map obtained at an etch-back depth of 2000 Å.
Figure 2A:
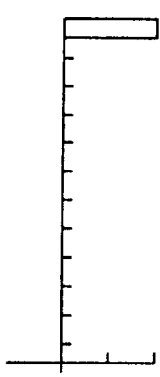
Figure 2B:
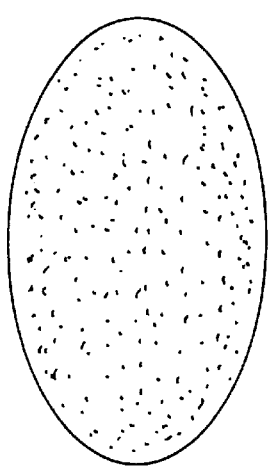
FIG. 2B is a wafer map obtained at an etch-back depth of 2500 Å.
Figure 2C:
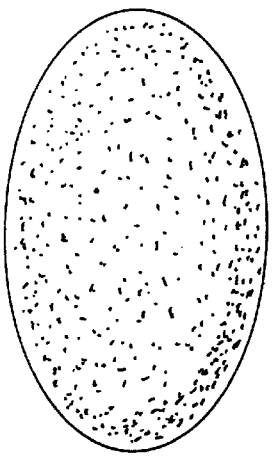
FIG. 2C is a wafer map obtained at an etch-back depth of 3000 Å.
Figure 2C:
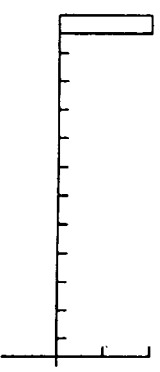
Figure 2D:
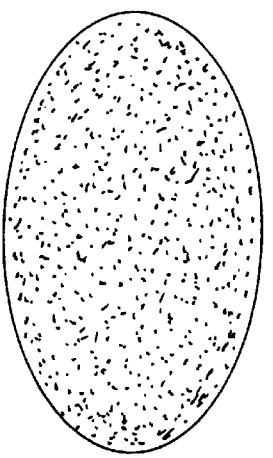
FIG. 2D is a wafer map obtained at an etch-back depth of 3500 Å.
Figure 2E:
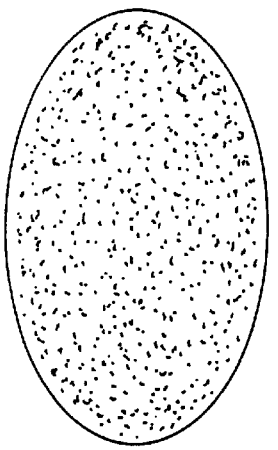
FIG. 2E is a wafer map obtained at an etch-back depth of 4000 Å.
Figure 2E:
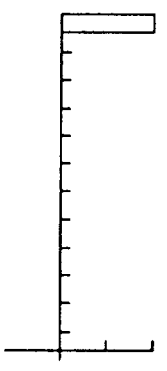
Figure 2F:
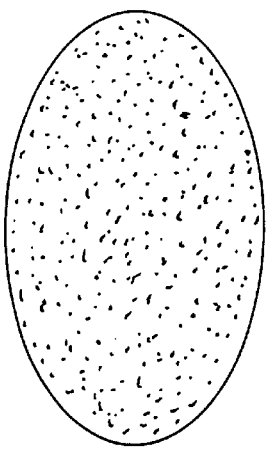
FIG. 2F is a wafer map obtained at an etch-back depth of 4500 Å.
Figure 3A:
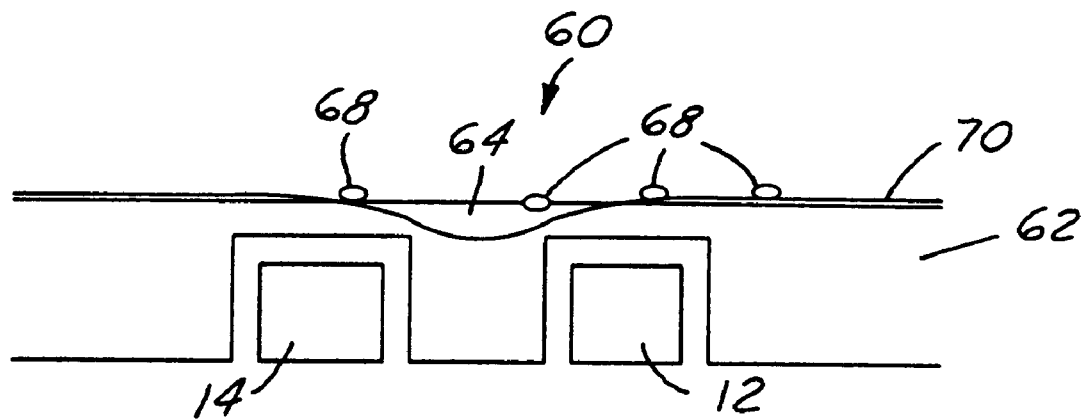
FIG. 3A is an enlarged, cross-sectional view of a present invention semiconductor structure having a second spin-on-glass layer etched back exposing metal ions.
Figure 3B:
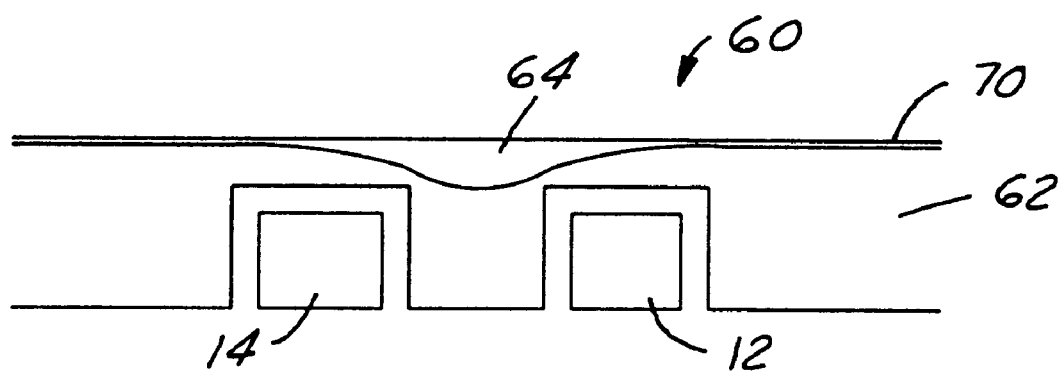
FIG. 3B is an enlarged, cross-sectional view of the present invention semiconductor structure of FIG. 3A after a scrubber clean process was conducted on the structure and metal ions removed.
Figure 3C:
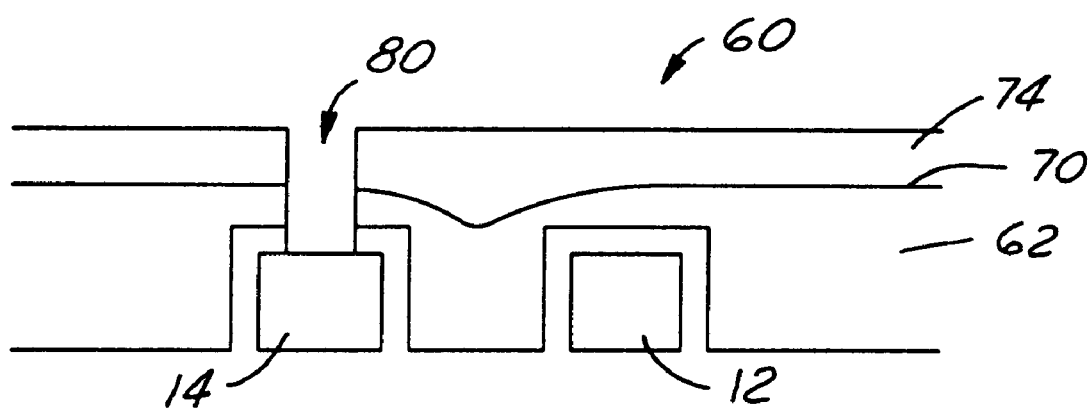
FIG. 3C is an enlarged, cross-sectional view of the present invention semiconductor structure of FIG. 3B having an additional oxide insulating layer formed on top and a via opening formed for providing communication with a metal conductor.

The present invention novel process can be further illustrated in FIGS. 3A~3C. As shown in FIG. 3A, a present invention semiconductor structure 60 is first provided which is similar to that shown in FIG. 1D. The structure 60 was formed by depositing a first SOG layer 62 to a thickness of approximately 3000 Å, after a surfactant layer is applied to the top surface, a second SOG layer 64 is deposited on top of the first SOG layer 62 to another 3000 Å thickness. The dual deposition process is preferred in ensuring that a smooth surface can be obtained in view of the high shrinkage ratio between a liquid SOG material when applied and a solid SOG material after curing. After an etch-back process is conducted for removing substantially the second SOG layer 64, only the first SOG layer 62 and a small portion of the second SOG layer 64 are left on the surface of the structure 60. Metal ions 68 such as that of calcium as a residue from the surfactant coating are also exposed on the interface 70 of the first/second SOG layers 62 and 64.

When the present invention novel method of scrubber clean is conducted on the interface 70, as shown in FIG. 3B, the calcium ions are removed to leave a clean surface on top of the first and the second SOG layers 62 and 64. In a subsequent process, an additional oxide insulating layer 74 is deposited on top of the first SOG layer 62 by a process such as plasma enhanced CVD method. A wet etch method, followed by a dry etch method are then used to form a via opening 80 such that electrical communication with metal conductor 14 can be established. It is seen in FIG. 3C that, due to the lack of calcium ions on the interface 70, no void formation is seen and thus no quality or reliability problems are found in the semiconductor structure 60.

The effectiveness of the present invention novel method is further shown in Table 2.

TABLE 2

| Lot # | #09 | #10 | #11 | #12 | #13 | #14 | #15 | #16 |
|---|---|---|---|---|---|---|---|---|
| Scrubber Clean | No | Yes | No | Yes | No | Yes | No | Yes |
| Defect Count | 7791 | 137 | 3831 | 95 | 705 | 164 | 3944 | 112 |
| Yield | 55.4% | — | 58.9% | 66.1% | 62.3% | 65.9% | 58.2% | 67.3% |

Experimental results based on eight separate lots of wafer production are shown. Lots 9, 11, 13 and 15 were processed without the additional scrubber clean step, while lots 10, 12, 14 and 16 were processed with the present invention novel scrubber clean step. It is seen that the defect count was reduced by as much as 60 folds with equally impressive results shown in the wafer yield.

The present invention novel method and devices formed by such method have therefore been amply demonstrated by the above descriptions and the appended drawings of FIGS. 3A~3C and Table 2. The present invention novel method can be easily implemented in a wafer fabrication process by incorporating the additional scrubber clean step.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

What is claimed is:

1. A method for insulating metal conductors by spin-on-glass comprising the steps of:
   providing a pre-processed semiconductor structure having metal conductors formed on a top surface,
   depositing a first insulating layer on top of said metal conductors and said top surface of the structure,
   planarizing said structure with a first spin-on-glass layer,
   coating a top surface of said first spin-on-glass layer with an adhesion promoter layer,
   planarizing said structure with a second spin-on-glass layer forming an interface with said first spin-on-glass layer,
   etching back said second spin-on-glass layer to substantially expose said interface,
   cleaning said substantially exposed interface in a scrubbing process, and
   depositing a second insulating layer on top of the interface.

2. A method for insulating metal conductors by spin-on-glass according to claim 1 further comprising the steps of forming said metal conductors by a stack of diffusion barrier layer/metal/adhesion layer.

3. A method for insulating metal conductors by spin-on-glass according to claim 1, wherein said first insulating layer is deposited of an oxide layer.

4. A method for insulating metal conductors by spin-on-glass according to claim 1, wherein said first spin-on-glass layer is deposited to a thickness between about 2000 Å and about 4000 Å.

5. A method for insulating metal conductors by spin-on-glass according to claim 1, wherein said first spin-on-glass layer is preferably deposited to a thickness of about 3000 Å.

6. A method for insulating metal conductors by spin-on-glass according to claim 1, wherein said adhesion promoter layer coated contains metal ions.

7. A method for insulating metal conductors by spin-on-glass according to claim 1, wherein said second spin-on-glass layer is deposited to a thickness between about 2000 Å and about 4000 Å.

8. A method for insulating metal conductors by spin-on-glass according to claim 1 further comprising the step of scrubber clean said substantially exposed interface with a bristle brush and a cleaning fluid of water.

9. A method for insulating metal conductors by spin-on-glass according to claim 1 further comprising the step of scrubber clean said substantially exposed interface with a polyvinyl alcohol (PVA) brush and a cleaning fluid of water.

10. A method for insulating metal conductors by spin-on-glass according to claim 1, wherein said second insulating layer deposited is a plasma enhanced oxide layer.

11. A method for insulating metal conductors by spin-on-glass according to claim 1, wherein said adhesion promoter layer contains calcium ions that cause void formation in a subsequent wet etch process for the formation of a via opening on said metal conductors.

12. A method for forming inter-metal dielectric layers in a semiconductor structure comprising the steps of:
    providing a pre-processed semiconductor structure having at least one layer of metal conductors on top,
    insulating an uppermost layer of metal conductor with a first plasma enhanced oxide layer,
    planarizing sequentially said structure with a first spin-on-glass layer and a second spin-on-glass layer with a surfactant coated interface between said two layers,
    etching back said second spin-on-glass layer to substantially expose said interface,
    scrubber clean said interface, and
    depositing a second plasma enhanced oxide layer on top of said cleaned surface.

13. A method for forming inter-metal dielectric layers in a semiconductor structure according to claim 12, wherein said surfactant coated at said interface contains metal ions.

14. A method for forming inter-metal dielectric layers in a semiconductor structure according to claim 12, wherein said surfactant coated at said interface contains calcium ions.

15. A method for forming inter-metal dielectric layers in a semiconductor structure according to claim 12 further comprising the step of scrubber clean said interface with a bristle brush and a cleaning fluid of water.

16. A method for forming inter-metal dielectric layers in a semiconductor structure according to claim 12 further comprising the step of scrubber clean said interface with a polyvinyl alcohol (PVA) brush and water until substantially all residual metal ions at the interface are removed.

* * * * *